(12) United States Patent
Lee et al.

(10) Patent No.: US 6,600,186 B1
(45) Date of Patent: Jul. 29, 2003

(54) PROCESS TECHNOLOGY ARCHITECTURE OF EMBEDDED DRAM

(75) Inventors: Jin-Yuan Lee, Hsin-Chu (TW); Mong-Song Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 117 days.

(21) Appl. No.: 09/670,328

(22) Filed: Sep. 27, 2000

Related U.S. Application Data

(62) Division of application No. 09/195,653, filed on Nov. 19, 1998, now Pat. No. 6,136,638.

(51) Int. Cl.[7] ...................... H01L 27/108; H01L 29/76; H01L 29/94; H01L 31/119
(52) U.S. Cl. ..................... 257/296; 257/300; 257/365
(58) Field of Search ................. 257/296, 300, 257/365

(56) References Cited

U.S. PATENT DOCUMENTS

| | | | | |
|---|---|---|---|---|
| 5,214,603 A | 5/1993 | Dhong et al. | ............... | 365/207 |
| 5,436,477 A | 7/1995 | Hashizume et al. | ......... | 257/310 |
| 5,519,237 A | * | 5/1996 | Itoh et al. ................ | 257/306 |
| 5,547,893 A | 8/1996 | Sung | ........................... | 437/52 |
| 5,600,598 A | 2/1997 | Skjaveland et al. | .... | 365/189.11 |
| 5,606,189 A | 2/1997 | Adan | ........................ | 257/303 |
| 5,668,035 A | 9/1997 | Fang et al. | ................ | 438/239 |
| 5,702,988 A | 12/1997 | Liang | ....................... | 438/238 |
| 5,712,201 A | 1/1998 | Lee et al. | .................. | 438/239 |
| 5,759,889 A | * | 6/1998 | Sakao | ....................... 438/241 |

* cited by examiner

Primary Examiner—Phat X. Cao
(74) Attorney, Agent, or Firm—George O. Saile; Stephen B. Ackerman; Billy Knowles

(57) ABSTRACT

Embedded DRAM cells within an ASIC having a pass transistor with a gate oxide having a thickness equal to the thickness of the gate oxide of the logic core. This allows the embedded DRAM cell to be activated by signals having voltage levels equal to the voltage levels created by the logic core. If the gate oxide has a thickness that is equal to the gate oxide thickness of the peripheral circuits, a signal provided by the word line voltage generator has voltage levels equal to those provided by peripheral circuits, and signal provided by the bit line voltage generator has voltage levels equal to those provided by logic circuits within the logic core. If the gate oxide has a thickness that is equal to the thickness of the gate oxide of the logic circuits, a signal provided by the word line voltage generator has voltage levels equal to those provided by the logic circuits, and the bit line voltage generator has voltage levels equal to those provided by the logic circuits.

20 Claims, 5 Drawing Sheets

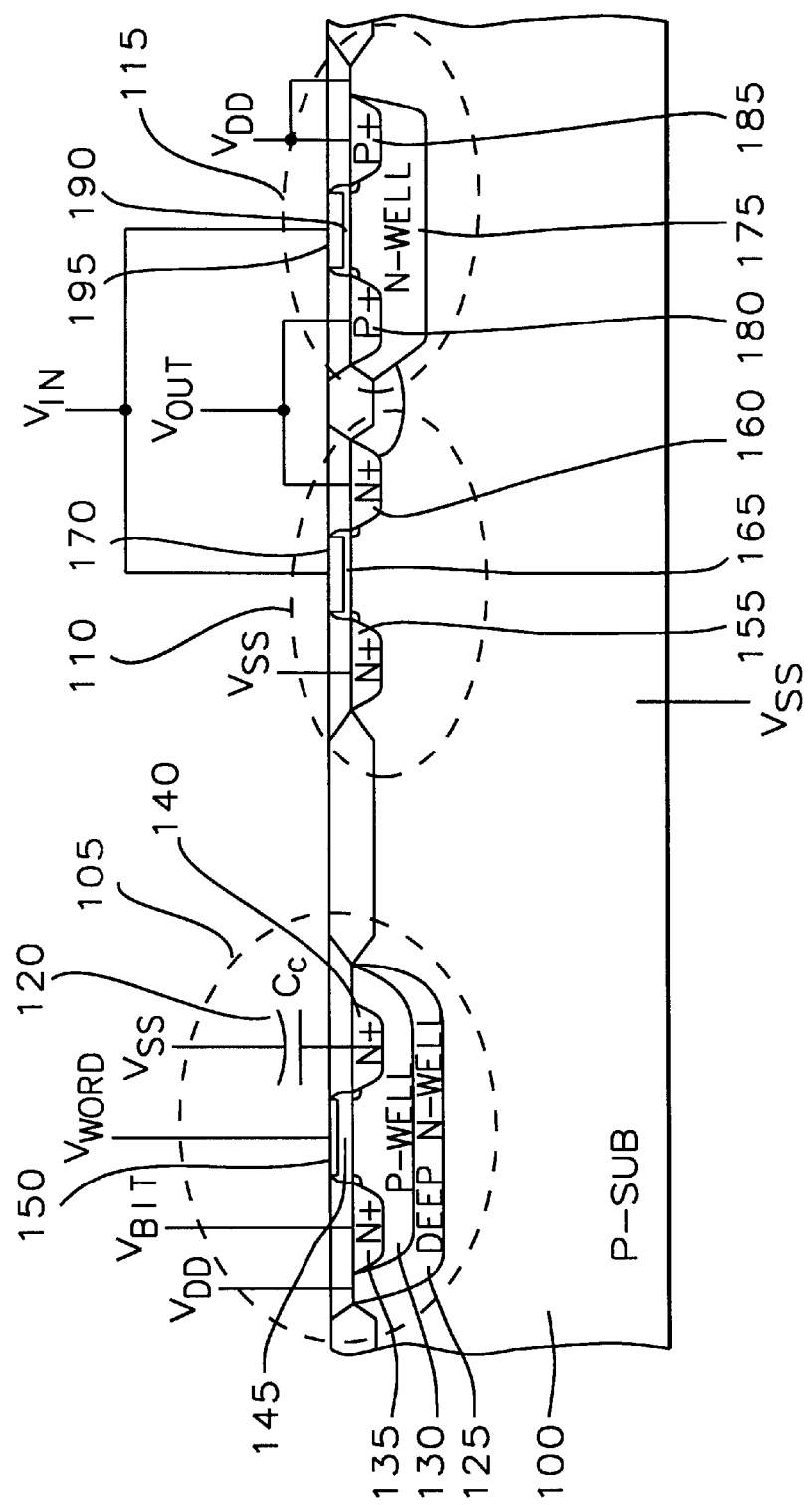
FIG. 1a – Prior Art

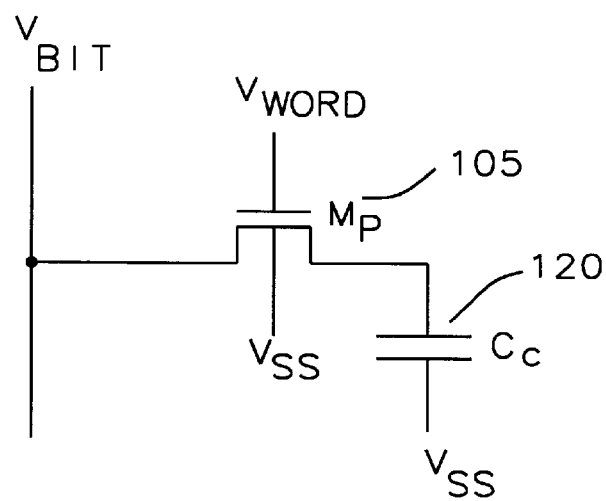
*FIG. 1b - Prior Art*
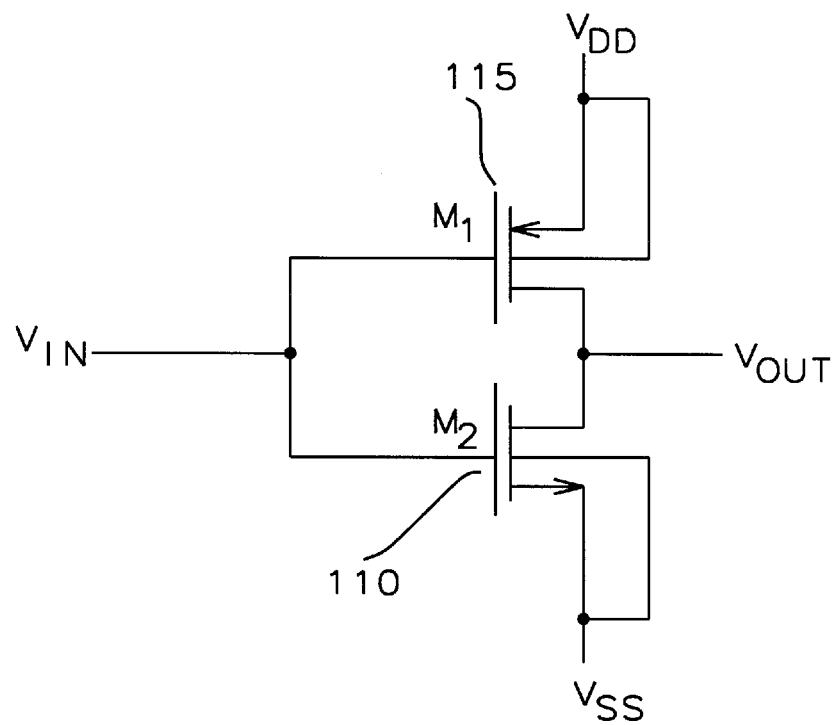
*FIG. 1c - Prior Art*

PROCESS TECHNOLOGY ARCHITECTURE OF EMBEDDED DRAM

This is a division of patent application Ser. No. 09/195,653, filing date Nov. 19, 1998, now U.S. Pat. No. 6,136,638, A Process Technology Architecture Of Embedded Dram, assigned to the same assignee as the present invention, now U.S. Pat. No. 6,136,638.

BACKGROUND OF THE INVENTION

1. Field of the Invention

This invention relates to integrated circuits containing logic circuits and embedded Dynamic Random Access Memory (DRAM). More particularly, this invention relates structures of pass transistors within the embedded DRAM such that the processing of the pass transistor is equivalent to that of transistors that form the logic core.

2. Description of the Related Art

Application Specific Integrated Circuits (ASIC) contain sections of circuitry that implement digital logic, provide peripheral circuits to interface to system function, memory, and analog functions. As DRAM has been embedded into an ASIC, the process for constructing the ASIC has become more complex.

Refer now to FIGS. 1a, 1b, and 1c for discussion of the structure of an ASIC containing a logic core and an embedded DRAM array. FIG. 1b illustrates an embedded DRAM cell. The embedded DRAM cell has a pass transistor Mp 105 and a cell capacitor $C_c$ 102. The first plate of the cell capacitor $C_c$ 102 is connected to the drain of the pass transistor Mp 105. The second plate of the cell capacitor is generally connected to the substrate biasing voltage source Vss. The second plate of the cell capacitor may alternatively be connected to a biasing voltage source that is one half the voltage level of the power supply voltage source $V_{DD}$.

The source of the pass transistor Mp 105 is connected to a bit line voltage generator $V_{BIT}$. The bit line voltage generator $V_{BIT}$ generates signals that have the appropriate voltage levels that are used to charge or discharge the cell capacitor $C_c$ 102. Generally the voltage level of the power supply voltage source $V_{DD}$ is used to represent a logical 1 and the ground reference level represents a logical 0.

The gate of the pass transistor Mp 105 is connected to the word line voltage generator $V_{WORD}$. The word line voltage generator $V_{WORD}$ activates the pass transistor Mp 105 when brought to a voltage level greater than the threshold voltage level Vt of the pass transistor Mp 105. If bit line voltage generator $V_{BIT}$ and thus the source of the pass transistor Mp 105 is at the voltage level of the power supply voltage source $V_{DD}$, the word line voltage generator has to have a voltage level that is from 1.5–2 times the voltage level of the power supply voltage source.

A basic logic circuit is shown in FIG. 1c. The N-channel MOS transistor M1 110 and the P-channel MOS transistor M2 115 are configured as a CMOS inverter. By appropriate placement of additional N-channel and P-channel MOS transistors within the circuit, more complex logic functions can be created. Further, the inverter can be constructed as a driver or receiver within peripheral circuits of the logic core by appropriate design of the transistor parameters and geometry.

The structure of a DRAM cell is shown in FIG. 1a. The pass transistor Mp 105 is formed on the semiconductor substrate 100 by first implanting an N-type material to a lightly doped concentration into the surface of the substrate 100 to form a deep N-well 125. A P-type material is then implanted into the surface of the semiconductor substrate 100 within the area of the deep N-well 125 to form the P-well 130. The N-type material is then diffused to highly doped concentration into the P-well 130 to form the source 135 and drain 140 of the pass transistor Mp 105.

The cell capacitor $C_c$ 120 is then formed by techniques known in the art, such as stacked capacitor or trench capacitor formation.

The transistors M1 115 and M2 110 of the logic circuit are formed concurrently with the pass transistor Mp 105. The N-type material is implanted to the lightly doped concentration to form the N-well 175. The N-type material is implanted to a highly doped concentration to form the source 155 and drain 160 of the N-channel transistor 110.

The P-type material is implanted to a highly doped concentration into the surface of the semiconductor substrate 100 to form the source 180 and the drain 185 of the P-channel MOS transistor 115.

A thin gate oxide is formed on the surface of the semiconductor substrate 100 in the areas 165 and 190 above the channel region between the source 155 and the drain 160 of the N-channel transistor 110, and the source 180 and the drain 185 of the P-channel transistor 115.

Since the voltage level of the word line voltage generator $V_{WORD}$ is as much as twice the voltage level of the power supply voltage source $V_{DD}$, the gate oxide 145 above the channel between the source 135 and the drain 140 of the pass transistor $M_p$ 105 is deposited as a thick gate oxide to prevent excess stress within the thick gate oxide 145. Having multiple thicknesses of the gate oxides 145, 165 and 190 complicates the fabrication process of an ASIC that includes embedded DRAM thus increasing cost. Further, having multiple steps of gate oxide formation causes a higher defect density with the gate oxide.

Typically, the thick oxide is formed to a thickness of from approximately 70 Å to approximately 150 Å, while the thin oxide has a thickness of from approximately 30 Å to approximately 70 Å for the logic circuit and the peripheral circuits. Generally the peripheral circuits have a higher operating voltage, and therefore require the thickness of the thin oxide and the thick oxide to be thicker than that of the logic circuit.

U.S. Pat. No. 5,668,035 (Fang et al.) discusses a method for fabricating an ASIC with an embedded memory array and a logic core. The method is described for forming a thin gate oxide for the logic core, while providing a thicker oxide for the memory cells having a boosted word line architecture. The method avoids applying photoresist directly to the gate oxide, and thereby prevents contamination. A first gate oxide is formed on the device areas on the substrate. A first polysilicon layer is deposited and patterned leaving portions over the memory cell areas. The first gate oxide is removed over the logic core areas, and is replaced by a thinner second gate oxide. A second polysilicon layer is deposited and patterned to remain over the logic core areas. The first and second polysilicon layers, having essentially equal thickness, are coated with an insulating layer. The FET gate electrodes for both the logic and memory cell areas are simultaneously patterned from the first and second polysilicon layers to complete the DRAM structure up to and including the gate electrodes.

U.S. Pat. No. 5,702,988 (Liang) describes a method of forming semiconductor logic devices and memory devices on a single semiconductor substrate. The memory devices that may be formed include nonvolatile memory, DRAM and/or SRAM. The method begins by forming triple-well structure of N-well regions, P-well regions, and P-well in N-well regions on a semiconductor substrate. Field isolation regions are then formed. A cell is formed for each memory device in the memory regions. A channel implant is performed in the substrate for each of the logic and memory devices. A gate and gate oxide is formed individually for each of the logic and memory devices. LDD (Lightly Doped Drain) active regions and heavily doped source/drain regions are formed adjacent to each gate. Additional memory structures are formed, such as a DRAM capacitor. An interlevel dielectric and contact openings therein are formed. One or more metal layers are subsequently deposited over the interlevel dielectric layer and in the openings to make contact to the contact regions.

U.S. Pat. No. 5,712,201 (Lee et al.) teaches a semiconductor fabrication process in which both DRAM and logic device structures are integrated on a single silicon chip. The process features combining process steps for both device types, while using only a single level of polysilicon for both a high capacity DRAM cell, as well as for a CMOS logic core. The high capacity DRAM cell is composed of an overlying polysilicon storage gate structure, a thin dielectric layer, and an underlying doped semiconductor region.

U.S. Pat. No. 5,547,893 (Sung) describes a method for simultaneously fabricating memory cells, CMOS devices, and bipolar devices on a semiconductor substrate using a minimum additional number of process steps and process complexity. The method of Sung simultaneously fabricates a CMOS DRAM and a vertical bipolar transistor with a low collector resistance and a N+ polysilicon emitter without using an epitaxy layer.

U.S. Pat. No. 5,600,598 (Skaveland et al.) teaches an embedded DRAM within an ASIC process. Skaveland et al. has a structure for storage of charge that avoids charge leakage from the storage capacitor to the substrate, and eliminates the requirement for a continuous voltage $V_{BB}$. The DRAM charge storage structure is comprised of a p-channel access FET in an n⁻ doped well of a p⁻ doped substrate, a p⁻ channel charge storage capacitor, conductive apparatus connecting a plate of the capacitor to a drain of the FET, and apparatus for applying a word line voltage to a gate of the FET.

Skaveland et al. further teaches a DRAM charge storage structure that is comprised of a charge storage capacitor structure connected between a high voltage source V and a source-drain circuit of a storage cell access FET, the gate of the storage cell access FET being connected to a word line. The cell access FET is comprised of first and second p doped regions separated by a channel and contained in an n⁻ doped region of a p⁻ doped substrate. The capacitor is comprised of an FET having a gate conductive region insulated from and disposed above the intrinsic n⁻ doped channel region. The gate conductive region of the capacitor is connected to the second p doped region of the FET spaced from the conductive region. A third p doped region is contained in the n⁻ doped channel region adjacent the edge of the conductive region. An n doped region is contained in the n doped region spaced from the third p-doped region. A high voltage $V_{pp}$ is applied to the n doped region and to the third p doped region. The bit line is connected to the first p doped region. Voltage is applied from the word line to a gate of the cell access FET that is boosted from the word line voltage $V_{dd}$.

U.S. Pat. No. 5,214,603 (Dhong et al.) teaches a folded bit line DRAM cell that includes a trench capacitor and a planar-configured access transistor. The access transistor is stacked over the capacitor and has a first terminal connected to the capacitor. Dhong et al. further describes a folded bit line DRAM cell that includes a vertically oriented access transistor having one terminal formed on the upper extent of a contact to the trench capacitor, to provide optimum electrical connection to between the access transistor and the contact of the trench capacitor.

U.S. Pat. No. 5,436,477 (Hashizume et al.) describes a DRAM memory cell where the transfer gate transistors are formed on a main surface of a semiconductor substrate. The transfer gate transistors have impurity regions for serving as source/drain regions. A first interlayer insulating film having a substantially flat upper surface is formed to cover the transfer gate transistors. The first interlayer insulating film is provided with contact holes reaching the impurity regions. Plugs are formed in the contact holes. Capacitors are only formed on the flat upper surface of the first interlayer insulating film. Lower electrodes of the capacitors and the plugs are electrically connected with each other through barrier layers.

U.S. Pat. No. 5,606,189 (Adan) describes a floating electrode capacitor (FEC) DRAM that occupies a small area on the substrate and which nevertheless has a great capacitance. Adan provides a dynamic RAM comprising (a) a pair of MOS transistors formed side by side on a substrate, (b) a trench formed in the substrate between Source/Drain active regions A and B adjacent to each other at one end of each of the MOS transistors, and (c) a stack capacitor comprising a first electrode layer connected to the impurity region A, capacitor insulating layer and a second electrode layer connected to the impurity region B the layers being formed one over another and embedded in the trench in the order mentioned.

SUMMARY OF THE INVENTION

An object of this invention is to provide an array of embedded DRAM cells within an ASIC having a pass transistor with a gate oxide having a thickness equal to the thickness of the gate oxide of the logic core.

Further, it is an object of this invention to provide an embedded DRAM cell in an array embedded within an ASIC that is activated by signals having voltage levels equal to the voltage levels created by the logic core.

To accomplish these and other objects an embedded DRAM cell is comprised of a cell capacitor to retain digital data as electrical charge and a pass transistor. The cell capacitor has a first plate connected to a biasing power supply voltage source. The pass transistors has a drain connected to a second plate of the cell capacitor, a source connected to bit line voltage generator, a gate connected to a word line generator, and a gate oxide. The gate oxide separates the gate from a channel region that separates the drain from the source. The gate oxide has a thickness that is equal to a thickness of gate oxide of either the peripheral circuits or the logic circuits of the logic core of the application specific integrated circuit.

If the gate oxide has a thickness that is equal to the gate oxide thickness of the peripheral circuits of the logic core, a signal provided by the word line voltage generator has voltage levels equal to voltage levels of signal provided by peripheral circuits within the logic core. A signal provided by the bit line voltage generator has voltage levels equal to voltage levels of signals provided by logic circuits within the logic core. The thickness of the gate oxide for the peripheral circuits and thus the gate oxide of the pass transistor is from approximately 30 Å thick to approximately 70 Å thick.

The signals of the word line voltage generator have a high level of from approximately 3.1 volts to approximately 5.5 volts. The signals of the bit line voltage generator have a high level of from approximately 2.3 volts to approximately 2.6 volts.

However, if the gate oxide has a thickness that is equal to the thickness of the gate oxide of the logic circuits, a signal provided by the word line voltage generator has voltage levels equal to voltage levels of signals provided by the logic circuits within the logic core. The signal provided by the bit line voltage generator has voltage levels equal to voltage levels of signals provided by the logic circuits within the logic core. The thickness of the gate oxide for the logic circuits and thus the gate oxide of the pass transistor is from approximately 30 Å thick to approximately 70 Å thick.

The signals of the word line voltage generator have a high level of from approximately 1.5 volts to approximately 3.3 volts. The signals of the bit line voltage generator have a high level of from approximately 1.5 volts. to approximately 3.3 volts.

BRIEF DESCRIPTION OF THE DRAWINGS

FIG. 1a is a cross sectional drawing illustrating the embedded DRAM cell and the fundamental logic circuit of an ASIC of the prior art.

FIG. 1b is a schematic diagram of an embedded DRAM cell of the prior art.

FIG. 1c is a schematic diagram of the logic circuit within an ASIC of the prior art.

DETAILED DESCRIPTION OF THE INVENTION

Figure 2A:
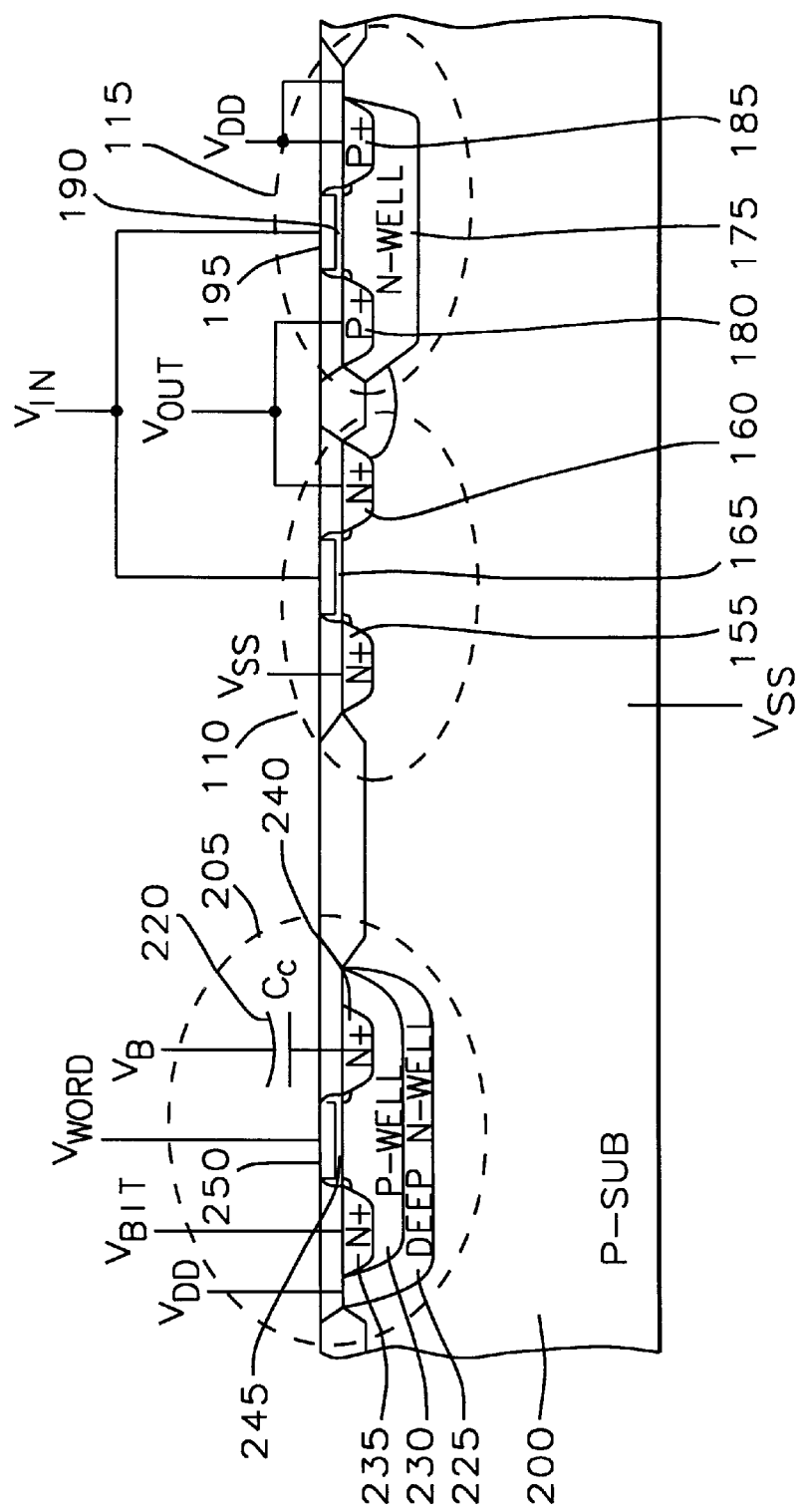
FIG. 2a is a cross sectional drawing illustrating the embedded DRAM cell and the logic circuit of an ASIC of this invention.
Figure 2B:
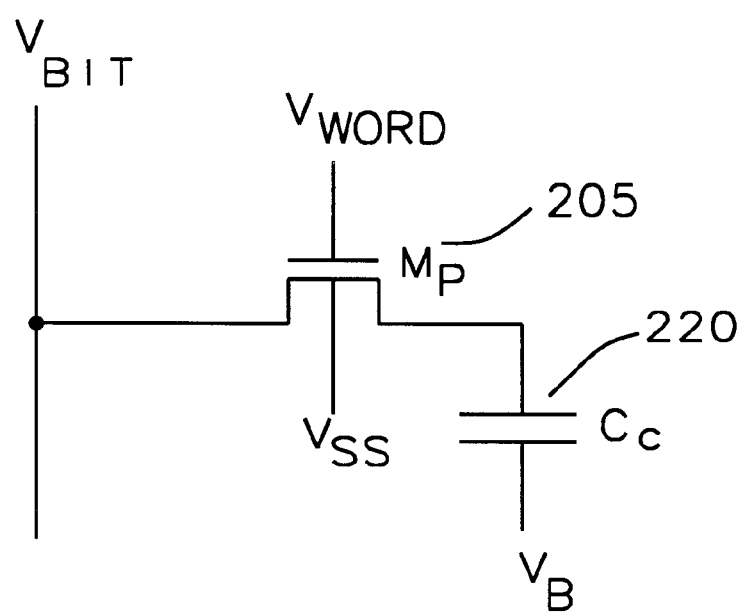
FIG. 2b is a schematic diagram of an embedded DRAM cell of this invention.

The embedded DRAM cell of this invention has a pass transistor $M_p$ 205 and cell capacitor $C_c$ 220 as shown in FIGS. 2a and 2b. An N-type material is implanted into the surface of the semiconductor substrate 200 to a lightly doped concentration to form the deep N-well 225 and the N-well 175. A P-type material is then implanted to a lightly doped concentration within the area of the deep N-well 225 to form the P-well 230.

The N-type material is again implanted into the surface, but to a highly doped concentration to form the source 235 and the drain 240 of the pass transistor $M_p$ 205 and the source 155 and drain 160 of the N-channel transistor 110.

The P-type material is implanted to a highly doped concentration into the surface of semiconductor substrate 200 in the area of the N-well 175 to form the source 185 and drain 180 of the P-channel transistor 115.

The N-channel transistor 110 and the P-channel transistor 115 form an inverter circuit. The inverter circuit is the fundamental circuit of the logic core of the ASIC as described in FIG. 1c.

A thin gate oxide 245 is formed on the surface of the semiconductor substrate 200 in the channel region between the source 235 and the drain 240 of the pass transistor 205. The thin gate oxides 165 and 190 are concurrently formed on the surface of the semiconductor substrate 200 in the channel regions between the source 155 and the drain 160 of the N-channel transistor 110 and the source 185 and the drain 180 of the P-channel transistor 115. The thin gate oxides 165 and 195 are fabricated as described in FIG. 1a.

The thickness of the gate oxide 245 is determined by the voltages of the signals applied to the source 235 by the bit line voltage generator $V_{BIT}$ and to the gate 250 by the word line voltage generator.

In the first embodiment of this invention, the gate oxide has a thickness of from approximately 30 Å to approximately 70 Å. This thickness is equivalent to the thickness of peripheral circuits of the logic core. The voltage level of the signals applied by the bit line voltage generator $V_{BIT}$ to the source 235 of the pass transistor $M_p$ 205 are from approximately 1.5 volts to approximately 3.3 volts. These signal levels are equivalent to the signal levels of the logic circuits of the logic core. The voltage levels of signals applied by the word line voltage generator $V_{WORD}$ to the gate 250 of the pass transistor $M_p$ 205 is from approximately 1.5 volts to approximately 3.3 volts. These signal levels are equivalent to the signal levels of the peripheral circuits of the logic core.

The second embodiment of this invention has a gate oxide thickness of from approximately 30 Å to approximately 70 Å. This thickness is equivalent to the thickness of the gate oxide of the logic circuits or the logic core.

The voltage level of signals applied by the bit line voltage generator $V_{BIT}$ to the source 235 of the pass transistor $M_p$ 205 are from approximately 1.5 volts to approximately 3.3 volts. This voltage is equivalent to the voltage levels of the logic circuitry.

Figure 3:
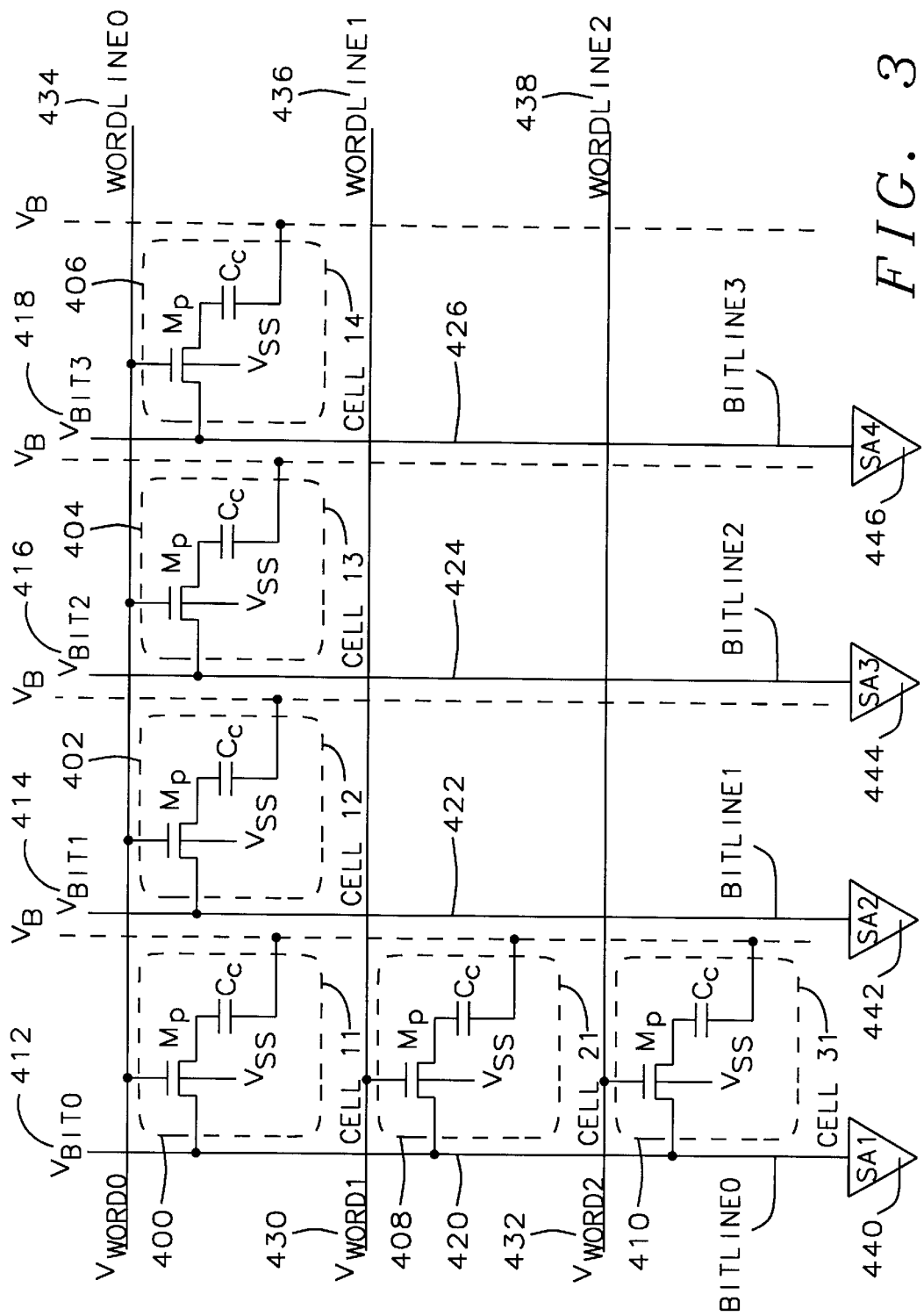
FIG. 3 is a schematic diagram of embedded DRAM array of this invention.

The capacitance of the cell capacitor $C_c$ 220 must be increased or the number of cell capacitors $C_c$ 220 present on each bit line of an array as shown in FIG. 3 is decreased to allow the transfer of the charge representing the digital data to the bit line to be sufficient to be detected by the sense amplifier of the array.

The voltage levels of the signals applied by the word line voltage generator $V_{WORD}$ are from approximately 1.5 Volts to approximately 3.3 volts. This voltage level is equivalent to the voltage levels of the logic circuitry of the logic core.

By having the voltage levels that activate the pass transistor $M_p$ 205 equal to the voltage levels of either the peripheral circuits or the logic circuits of the logic core, there is no added complexity for the process to fabricate the transistors of the ASIC including the embedded Dram than for the ASIC containing only a logic core. Further, the thinner gate oxide 245 will have a lower defect density since extra steps are not required to form the gate oxide 245.

Refer now to FIG. 3 for a discussion of an embedded array of DRAM cells within an ASIC. The embedded array of DRAM cells has multiple DRAM cells, CELL 11 400, CELL 12 402, CELL 13 404, CELL 14, 406, CELL 21 408, and CELL 31 410 arranged rows and columns. The bit line voltage generator $V_{BIT}0$ 412 is connected to the bit line 420 which is connected to the sources of the pass transistors $M_p$ of the column of embedded DRAM cells CELL 11 400, CELL 21 408, and CELL 31 410. Likewise, the sources of the pass transistors $M_p$ of the embedded DRAM cells CELL 12 402, CELL 13 404, and CELL 14 406 are respectively connected to the bit line voltage generators $V_{BIT}1$ 414, $V_{BIT}2$ 416, $V_{BIT}3$ 418.

The word line voltage generator $V_{WORD}0$ 428 is connected to the gates of the pass transistor of the row of the embedded DRAM cells CELL 11 400, CELL 12 402, CELL 13 404, and CELL 14, 406. Likewise, the word line voltage generators $V_{WORD}1$ 430 and $V_{WORD}2$ 432 are respectively connected to the gates of the pass transistor Mp of embedded DRAM cells CELL 21 408 and CELL 31 410.

The bias voltage source $V_B$ is connected to the second plate of the cell capacitor $C_c$ of the embedded DRAM cell CELL 11 400, CELL 12 402, CELL 13 404, CELL 14, 406, CELL 21 408, and CELL 31 410 to provide the back bias for the cell capacitors $C_c$. The bias voltage source $V_B$ is held to a constant voltage that is one half the voltage level of the power supply voltage source $V_{DD}$ Each of the bit lines 420, 422, 424, and 426 is connected to the sense amplifiers SA1 440, SA2 442, SA3 444, and SA4 446. The sense amplifiers SA1 440, SA2 442, SA3 444, and SA4 446 detect the level of a charge present of a selected embedded DRAM cell from the embedded array of DRAM cells.

Each of the bit line voltage generators $V_{BIT}0$ 412, $V_{BIT}1$ 414, $V_{BIT}2$ 416, and $V_{BIT}3$ 418 will create signals having voltage levels of the logic circuits of the logic core if the pass transistor $M_p$ of the embedded DRAM cells CELL 11 400, CELL 12 402, CELL 13 404, CELL 14, 406, CELL 21 408, and CELL 31 410 have a gate oxide thickness of the peripheral circuits of the logic core. However, each of the bit line generators $V_{BIT}0$ 412, $V_{BIT}1$ 414, $V_{BIT}2$ 416, and $V_{BIT}3$ 418 will create signals having voltage levels of the logic circuits less the differential voltage described above of the logic core, if the pass transistors $M_p$ of the of the embedded DRAM cells CELL 11 400, CELL 12 402, CELL 13 404, CELL 14, 406, CELL 21 408, and CELL 31 410 have a gate oxide thickness of the peripheral circuits of the logic core.

Each of the word line voltage generators $V_{WORD}0$ 428, $V_{WORD}1$ 430, and $V_{WORD}2$ 432 will create signals having voltage levels of the peripheral circuits of the logic core as described above, if the pass transistors $M_p$ of the embedded DRAM cells CELL 11 400, CELL 12 402, CELL 13 404, CELL 14, 406, CELL 21 408, and CELL 31 410 have a gate oxide thickness of the peripheral circuits of the logic core. However, each of the word line generators $V_{WORD}0$ 428, $V_{WORD}1$ 430, and $V_{WORD}2$ 432 will create signals having voltage levels of the logic circuits of the logic core as described above, if the pass transistor $M_p$ of the embedded DRAM cells CELL 11 400, CELL 12 402, CELL 13 404, CELL 14, 406, CELL 21 408, and CELL 31 410 have a gate oxide thickness of the logic circuits of the logic core.

It is well known in the art that the N-well 175 of FIG. 2a can be expanded to incorporate the source 155 and the drain 160 of the N-channel transistor 110. This "triple well" construction will require an implantation of the P-type material to a lightly doped concentration in the region of P-channel 110. Thus, the structure of the logic core will more closely resemble that of the pass transistor $M_p$ 205 of embedded DRAM cell.

While this invention has been particularly shown and described with reference to the preferred embodiments thereof, it will be understood by those skilled in the art that various changes in form and details may be made without departing from the spirit and scope of the invention.

The invention claimed is:

1. An embedded DRAM cell within a DRAM array of an application specific integrated circuit on a semiconductor substrate comprising:
   a cell capacitor to retain digital data within said embedded DRAM cell as electrical charge having a first plate connected to a biasing power supply voltage source; and
   a pass transistor having a drain connected to a second plate of the cell capacitor, a source connected to bit line voltage generator, a gate connected to a word line generator, and a gate oxide that separates said gate from a channel region that separates said drain from said source, whereby said gate oxide has a thickness that is equal to a thickness of gate oxide in a logic core of said application specific integrated circuit;
   wherein a signal provided by the word line voltage generator has voltage levels equal to voltage levels of signals provided by peripheral circuits within said logic core; and
   wherein the thickness of the gate oxide is equal to the thickness of the gate oxide of the peripheral circuits within the logic core.

2. The embedded DRAM cell of claim 1 wherein a signal provided by the bit line voltage generator has voltage levels equal to voltage levels of signals provided by logic circuits within said logic core.

3. The embedded DRAM cell of claim 1 wherein the thickness of the gate oxide is from approximately 30 Å thick to approximately 70 Å thick.

4. The embedded DRAM cell of claim 1 wherein the signals of the word line voltage generator have a high-level of from approximately 1.5 volts to approximately 3.3 volts.

5. The embedded DRAM cell of claim 2 wherein the signals of the bit line voltage generator have a high level of from approximately 1.5 volts to approximately 3.3 volts.

6. An embedded DRAM cell within a DRAM array of an application specific integrated circuit on a semiconductor substrate comprising:
   a cell capacitor to retain digital data within said embedded DRAM cell as electrical charge having a first plate connected to a biasing power supply voltage source; and
   a pass transistor having a drain connected to a second plate of the cell capacitor, a source connected to bit line voltage generator, a gate connected to a word line generator, and a gate oxide that separates said gate from a channel region that separates said drain from said source, whereby said gate oxide has a thickness that is equal to a thickness of gate oxide in a logic core of said application specific integrated circuit;
   wherein the signal provided by the word line voltage generator has voltage levels equal to voltage levels of signals provided by the logic circuits within said logic core; and
   wherein the thickness of the gate oxide is equal to the thickness of the gate oxide of the logic circuits within said logic core.

7. The embedded DRAM cell of claim 6 wherein the signal provided by the bit line voltage generator has voltage levels equal to voltage levels of signals provided by the logic circuits within said logic core.

8. The embedded DRAM cell of claim 6 wherein the thickness of the gate oxide is from approximately 30 Å thick to approximately 70 Å thick.

9. The embedded DRAM cell of claim 6 wherein the signals of the word line voltage generator have a high level of from approximately 1.5 volts to approximately 3.3 volts.

10. The embedded DRAM cell of claim 7 wherein the signals of the bit line voltage generator have a high level of from approximately 1.5 volts to approximately 3.3 volts.

11. An array of DRAM cells embedded within an application specific integrated circuit on a semiconductor substrate, comprising
    an array of embedded DRAM cell arranged in rows and columns, whereby each embedded DRAM cell comprises:
    a cell capacitor to retain digital data within said embedded DRAM cell's electrical charge having a first plate connected to a biasing power supply voltage source; and a pass transistor having a drain connected to a second plate of the cell capacitor, a source connected to bit line voltage generator, a gate connected to a word line generator, and a gate oxide that separates said gate from a channel region that separates said drain from said source, wherein the thickness of the gate oxide is equal to the thickness of the gate oxide of the peripheral circuits within the logic core;

a biasing power supply connected to the second plate of the cell capacitors;

a plurality of bit line voltage generators, each bit line voltage generator connected to the source of the pass transistor to transfer the electrical charge to a selected cell capacitor on one column of the array of embedded DRAM cells; and a plurality of word line voltage generators, each word line voltage generator connected to the gate of the pass transistors on one row of the array of embedded DRAM cells to select the row of the array of embedded DRAM cells wherein a signal provided by each word line voltage generator has voltage levels equal to voltage levels of signal provided by peripheral circuits within said logic core.

12. The array of embedded DRAM cells of claim 11 wherein a signal provided by each bit line voltage generator has voltage levels equal to voltage levels of signals provided by logic circuits within said logic core.

13. The array of embedded DRAM cells of claim 11 wherein the thickness of the gate oxide is from approximately 30 Å thick to approximately 70 Å thick.

14. The array of embedded DRAM cells of claim 11 wherein the signals of each word line voltage generator have a high level of from approximately 1.5 volts to approximately 3.3 volts.

15. An array of DRAM cells embedded within an application specific integrated circuit on a semiconductor substrate, comprising an array of embedded DRAM cell arranged in rows and columns, whereby each embedded DRAM cell comprises:

a cell capacitor to retain digital data within said embedded DRAM cell's electrical charge having a first plate connected to a biasing power supply voltage source; and a pass transistor having a drain connected to a second plate of the cell capacitor, a source connected to bit line voltage generator, a gate connected to a word line generator, and a gate oxide that separates said gate from a channel region that separates said drain from said source, wherein the thickness of the gate oxide is equal to the thickness of the gate oxide of the logic circuits within said logic core;

a biasing power supply connected to the second plate of the cell capacitors;

a plurality of bit line voltage generators, each bit line voltage generator connected to the source of the pass transistor to transfer the electrical charge to a selected cell capacitor on one column of the array of embedded DRAM cells; and a plurality of word line voltage generators, each word line voltage generator connected to the gate of the pass transistors on one row of the array of embedded DRAM cells to select the row of the array of embedded DRAM cells;

wherein the signal provided by each word line voltage generator has voltage levels equal to voltage levels of signals provided by the logic circuits within said logic core.

16. The array of embedded DRAM cells of claim 15 wherein the signal provided by each bit line voltage generator has voltage levels equal to voltage levels of signals provided by the logic circuits within said logic core.

17. The array of embedded DRAM cells of claim 15 wherein the thickness of the gate oxide is from approximately 30 Å thick to approximately 70 Å thick.

18. The array of embedded DRAM cells of claim 15 wherein the signals of each bit line voltage generator have a high level of from approximately 1.5 volts to approximately 3.3 volts.

19. The array of embedded DRAM cells of claim 15 wherein the signals of each word line voltage generator have a high level of from approximately 1.5 volts to approximately 3.3 volts.

20. The array of embedded DRAM cells of claim 16 wherein the signals of each bit line voltage generator have a high level of from approximately 1.5 volts to approximately 3.3 volts.

\* \* \* \* \*